United States Patent [19]
Taylor

[11] Patent Number: 5,343,160
[45] Date of Patent: Aug. 30, 1994

[54] FULLY BALANCED TRANSIMPEDANCE AMPLIFIER WITH LOW NOISE AND WIDE BANDWIDTH

[75] Inventor: Stewart S. Taylor, Beaverton, Oreg.

[73] Assignee: TriQuint Semiconductor, Inc., Beaverton, Oreg.

[21] Appl. No.: 964,173

[22] Filed: Oct. 21, 1992

[51] Int. Cl.⁵ .......................... H03F 1/14; H03F 3/08
[52] U.S. Cl. ...................................... 330/9; 330/295; 330/308
[58] Field of Search .............. 330/9, 124 R, 129, 253, 330/282, 295, 308

[56] References Cited

U.S. PATENT DOCUMENTS 4,808,942  2/1989  Milkovic .................................. 330/9
5,095,286  3/1992  Cole et al. ............................. 330/308

Primary Examiner—Steven Mottola
Attorney, Agent, or Firm—Skjerven, Morrill, MacPherson, Franklin & Friel

[57] ABSTRACT

A circuit is provided that solves the problem of implementing a fully balanced (differential) transimpedance amplifier with low-noise and wide bandwidth. This is accomplished by direct coupling the feedback resistors from the outputs of the amplifier to the inputs without the use of a blocking capacitor. The low frequency response is thereby improved and the problems created by a DC bias resistor that degrades the noise performance and, in some case, restricts the dynamic range (caused by pulse width distortion for large signals) are eliminated. The amplifier achieves higher voltage gain than prior designs and also results in lower noise and wider bandwidth. The differential nature of the amplifier provides good power supply rejection. While the preferred embodiment is particularly well-suited to GaAs MESFET technology, the invention can also be applied to silicon bipolar and MOS technology.

42 Claims, 5 Drawing Sheets

FULLY BALANCED TRANSIMPEDANCE AMPLIFIER WITH LOW NOISE AND WIDE BANDWIDTH

BACKGROUND OF THE INVENTION

1. Field of the Invention

This invention relates to amplifier circuits and more particularly to differential transimpedance amplifier circuits.

2. Description of the Relevant Art

Fully balanced or differential transimpedance amplifiers are utilized in a variety of applications where it is desirable to convert a current-varying signal into a voltage-varying signal. One such application is within optical receiver systems where the transimpedance amplifier is used to convert the current-varying output signal of a photodetector into a voltage signal that is processed by other circuitry. Although fully balanced or differential transimpedance amplifiers are typically associated with favorable power supply rejection characteristics, they are also often characterized with a relatively low voltage gain, a large low-cutoff frequency, poor noise performance, limited dynamic range, and/or a low bandwidth.

A typical differential transimpedance amplifier circuit for an optical receiver system is shown in FIG. 1. The amplifier includes a differential pair of transistors 10 and 11 and source follower transistors 13 and 14 connected through level shifting diodes 16 and 17. Feedback resistors 19 and 20 couple output voltages $V_{o1}$ and $V_{o2}$ to the gate inputs of transistors 10 and 11 to broadband the amplifier (i.e. increase the bandwidth) and stabilize the DC bias point. One terminal of a photodetector 22 (typically a metal-semiconductor-metal (MSM) detector) is DC coupled to the gate of transistor 10 while a second terminal is AC coupled to the gate of transistor 11 with a blocking capacitor 23. This coupling allows the photocurrent from photodetector 22 to circulate partially through resistors 19 and 20 to produce a balanced differential output voltage. Noise on power supply $V_{DD}$ is partially common-mode and is partly rejected by the next differential stage. Bias resistor 25 establishes the DC voltage at the second terminal of photodetector 22 to provide the required bias voltage.

The amplifier circuit of FIG. 1 is differential and thus provides a moderate amount of power supply rejection. However, the amplifier has a relatively low voltage gain, a relatively large low-cutoff frequency, poor noise performance, limited dynamic range, and/or low bandwidth. The voltage gain is low because the voltage drop across the load resistors 27 and 28 is small. The low-cutoff frequency is high because the on-chip capacitor 23 is small. The noise performance is poor because the voltage gain of the input stage is low (more proportional noise contribution from resistors 19, 20, 27 and 28, and the second stage) and because bias resistor 25 is usually small. To achieve high bandwidth, resistors 19 and 20 must be small because of the low voltage gain. This degrades noise performance as mentioned previously. If resistors 19 and 20 are chosen to be large for good noise performance, the bandwidth will be low because of the low voltage gain.

A differential transimpedance amplifier that rejects power supply noise, that has a relatively large voltage gain (to improve both the noise performance and bandwidth), that has a small low-frequency cutoff, and that has a means for establishing the DC bias potential across the input photodetector without the use of a bias resistor (which degrades noise performance and limits dynamic range) is therefore desirable.

SUMMARY OF THE INVENTION

In accordance with the present invention, a circuit is provided that solves the problem of implementing a fully balanced (differential) transimpedance amplifier with low-noise and wide bandwidth. This is accomplished by direct coupling the feedback resistors from the outputs of the amplifier to the inputs without the use of a blocking capacitor. Supplemental voltage offset means establishes the correct DC bias voltage across the photodetector. The low frequency response is thereby improved and the problems created by a DC bias resistor that degrades the noise performance and, in some cases, restricts the dynamic range (caused by pulse-width distortion for large signals) are eliminated. An amplifier in accordance with the invention achieves higher voltage gain than prior designs and also results in lower noise and wider bandwidth. The differential nature of the amplifier provides good power supply rejection. While the preferred embodiment is particularly well-suited to GaAs (gallium arsenide) MESFET technology, the invention can also be applied to other compound semiconductor technologies, as well as silicon bipolar and MOS technologies.

These and other advantages are achieved with the present invention, in accordance with which a balanced transimpedance amplifier circuit comprises first and second amplifier circuits for amplifying signals at first and second input lines, a first capacitor coupled between the first input line and the first amplifier, and a second capacitor coupled between the second input line and the second amplifier circuit. The balanced transimpedance amplifier circuit further comprises a first feedback network coupled between the first amplifier circuit and the first input line, a second feedback network coupled between the second amplifier circuit and the second input line, and first and second voltage offset means coupled in series with the first and second feedback networks, respectively.

The invention will be more readily understood with reference to the drawings and the detailed description. As will be appreciated by one skilled in the art, the invention is applicable to differential transimpedance amplifiers in general and is not limited to the specific embodiment disclosed.

DETAILED DESCRIPTION

The following includes a detailed description of the best presently contemplated mode for carrying out the invention. The description is intended to be merely illustrative of the invention and should not be taken in a limiting sense.

Figure 2:
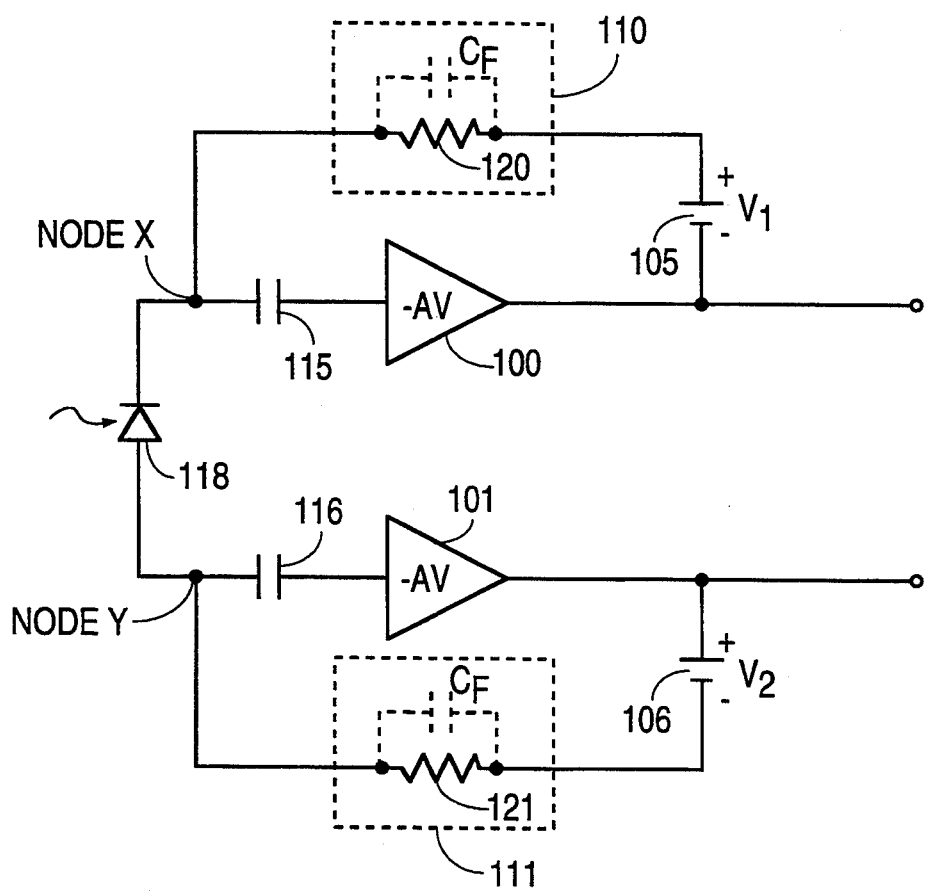
FIG. 2 is a block diagram illustrating a first embodiment of a transimpedance amplifier circuit in accordance with the present invention.

Referring first to FIG. 2, a block diagram is shown of a transimpedance amplifier circuit according to the present invention. In this embodiment, the transimpedance amplifier circuit is incorporated within an optical receiver system and thus includes a photodetector 118 that receives modulated optical signals from a transmitter. The transimpedance amplifier circuit includes two identical amplifiers 100 and 101 each with a voltage gain of −A. Two independent voltage offset means 105 and 106 couple the output signal of each amplifier 100 and 101 to separate feedback networks 110 and 111 and provide shifted DC voltage levels of $V_1$ and $V_2$, respectively. The voltage offset means 105 and 106 could be implemented using transistors, diodes, resistors or other level shifting circuits well known to those skilled in the art. In addition, feedback networks 110 and 111 are each shown with a single feedback resistor 120 and 121, respectively, although other feedback configurations could be used, such as the incorporation of a capacitor $C_F$ (shown in dashed lines) connected in parallel with the associated feedback resistor. Furthermore, a variety of automatic gain control (AGC) circuitry for extending the dynamic range by attenuating large signals could be added or incorporated within the feedback networks without departing from the spirit of the present invention.

Figure 1:
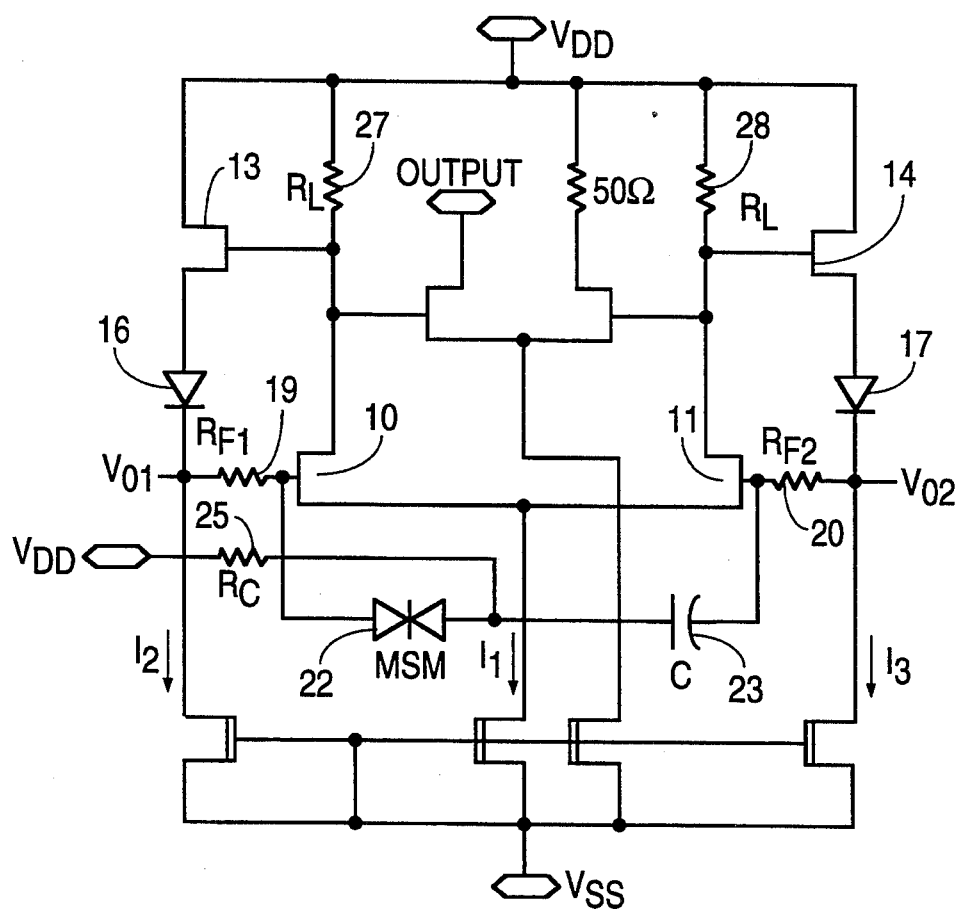
FIG. 1 is a schematic diagram illustrating a typical differential transimpedance amplifier circuit used within an optical receiver system.

The transimpedance amplifier circuit also includes two capacitors 115 and 116 which couple the output signals of photodetector 118 to the input nodes of amplifiers 100 and 101. The feedback resistors 120 and 121 couple each output line of photodetector 118 to each independent offset means 105 and 106 at the output lines of the amplifier. This arrangement allows the DC potential at nodes X and Y to be set independently to establish the necessary bias voltage across photodetector 118 without using a biasing resistor or a blocking capacitor as exemplified in the circuit of FIG. 1. Coupling capacitors 115 and 116 allow the input potentials of the amplifiers 100 and 101 to be set independently (usually at a value close to the negative supply) of the output potentials. This results in an amplifier with improved voltage gain characteristics since more voltage can be provided across the load resistors. Higher voltage gain produces increased bandwidth since this is a feedback amplifier. Higher voltage gain also reduces noise because the noise in the load resistor is smaller when the voltage gain is high and because a larger feedback resistor can be used for a given bandwidth. The mean-squared noise current from the feedback resistor is inversely related to the feedback resistor value. While coupling capacitors 115 and 116 pose a low frequency limit on the circuit, they are connected within the feedback loop and can have substantially smaller values than the blocking capacitor exemplified in FIG. 1. Equivalently, for a given value of the coupling capacitor, the low frequency bandwidth is lower for the circuit of FIG. 2 than for that of FIG. 1.

The amplifier circuit of FIG. 2 can be designed to operate with a single 5 volt power supply with excellent performance. Performance can be enhanced if a +/−5 volt power supply is used since more voltage gain can be obtained per stage. Since the amplifier is differential in nature, power supply noise is substantially rejected.

Figure 3:
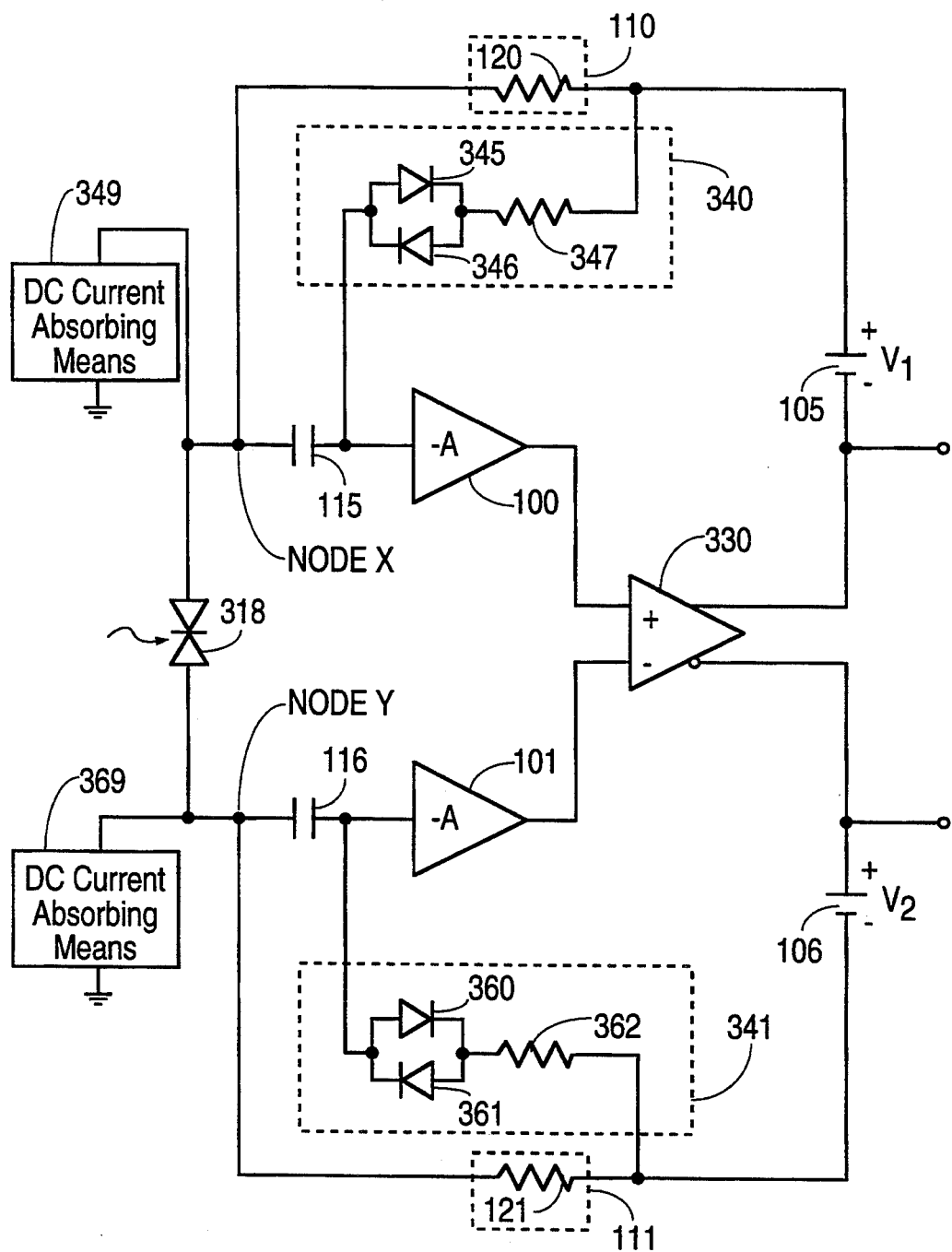
FIG. 3 is a block diagram illustrating a second embodiment of a transimpedance amplifier circuit in accordance with the present invention.

Referring next to FIG. 3, a block diagram is shown of a second embodiment of a transimpedance amplifier circuit in accordance with the present invention. The embodiment of FIG. 3 is formed with a two-stage amplifier network. Circuit blocks corresponding to those of FIG. 2 are numbered identically. The embodiment of FIG. 3 includes a differential amplifier stage 330 having input nodes coupled to the respective output nodes of amplifiers 100 and 101. A non-inverting output line of differential amplifier stage 330 is coupled to voltage offset means 105 and an inverting output line of differential amplifier stage 330 is coupled to voltage offset means 106. An MSM photodetector 310 is shown connected to coupling capacitors 115 and 116. Amplifiers 100 and 101 are single-ended to produce maximum voltage gain and minimum noise. Differential amplifier stage 330 allows a two-stage design for high gain and high stability.

The transimpedance amplifier circuit of FIG. 3 is also shown with automatic gain control blocks 340 and 341 connected to feedback networks 110 and 111 and amplifiers 100 and 101. The automatic gain control block 340 includes diodes 345 and 346 and a resistor 347. Similarly, the automatic gain control block 341 includes diodes 360 and 361 and a resistor 362. It is noted that the automatic gain control blocks 340 and 341 are each variable impedance devices that provide for the automatic gain control function.

DC current absorbing means 349 and 369 are further connected to the transimpedance amplifier circuit to absorb or remove the DC current from photodetector 318 under large signal conditions. Specific circuitry forming the DC current absorbing means 349 and 369 is known to those skilled in the art and is disclosed, for example, in U.S. Pat. No. 5,030,925 issued Jul. 9, 1991 to Stewart S. Taylor. This patent is incorporated herein by reference in its entirety.

Figure 4:
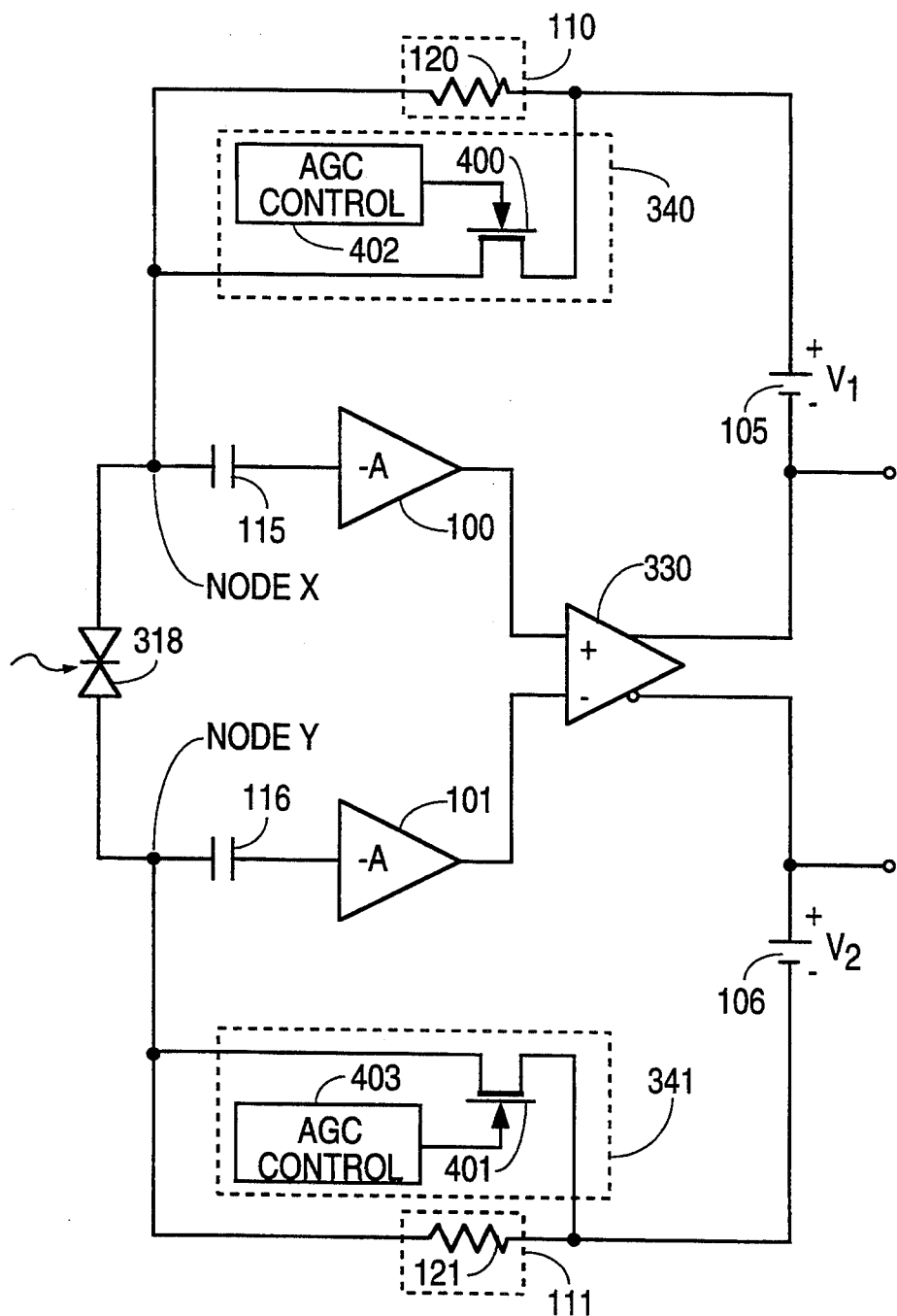
FIG. 4 is a block diagram illustrating a third embodiment of a transimpedance amplifier circuit in accordance with the present invention.

FIG. 4 shows an alternative embodiment for implementing the automatic gain control function within the transimpedance amplifier circuit. The automatic gain control blocks 340 and 341 shown in FIG. 4 are connected to the output lines of photodetector 318 instead of the input nodes of amplifiers 100 and 101. Each automatic gain control block 340 and 341 includes a field effect transistor 400 and 401, respectively, having an impedance that is controlled by an associated amplitude feedback AGC control circuit 402 or 403.

Figure 5:
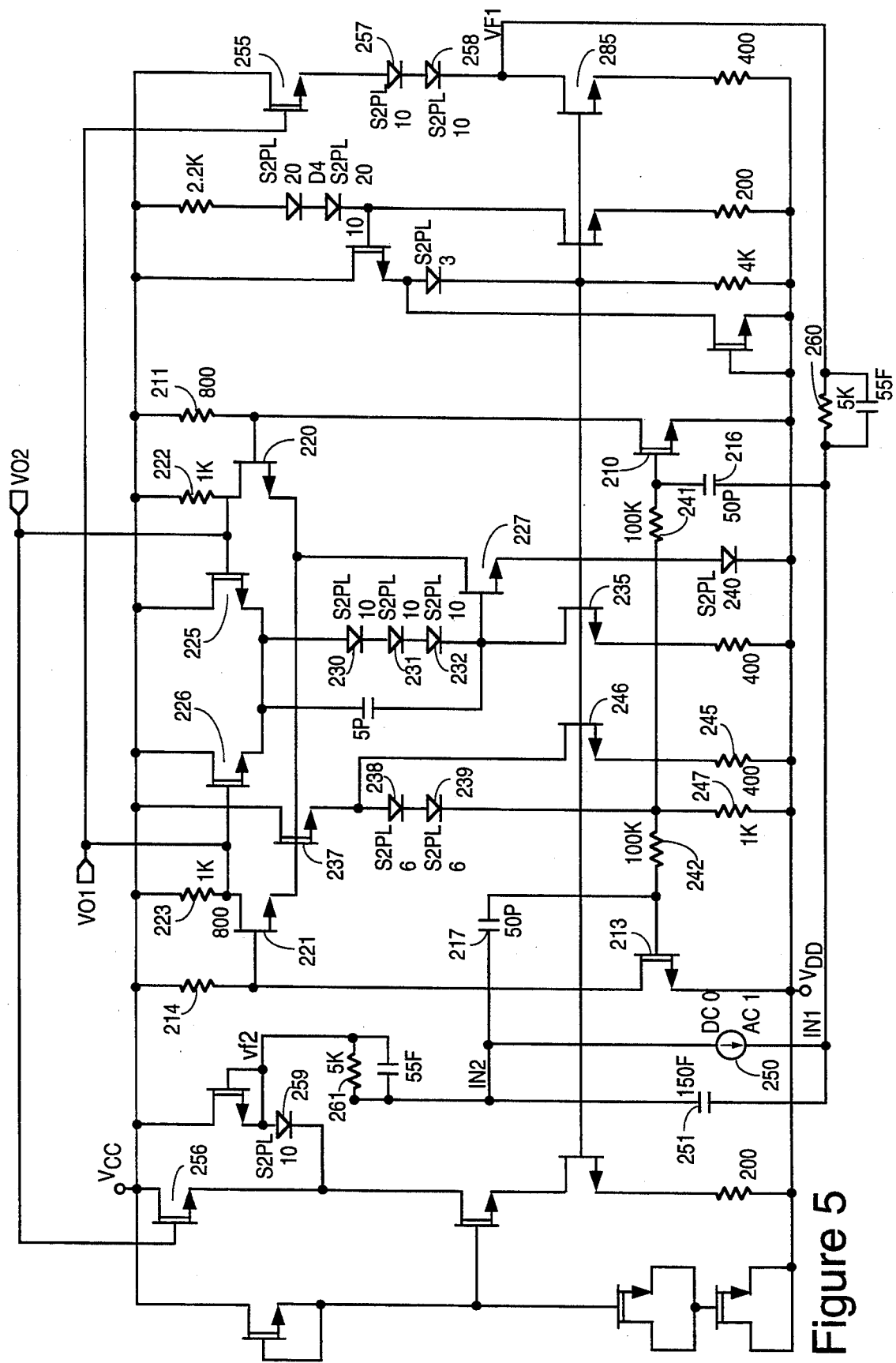
FIG. 5 is a schematic diagram of a specific implementation of a transimpedance amplifier circuit according to the invention.

Referring finally to FIG. 5, a preferred embodiment of a transimpedance amplifier circuit in accordance with the invention is shown that operates from a single 5 volt supply. The embodiment of FIG. 5 is a two-stage transimpedance amplifier circuit that conforms generally to the block diagram of FIG. 4 without the incorporation of AGC circuiting. The transimpedance amplifier circuit includes two single-ended input amplifiers that form a first stage and a differential amplifier that forms a second stage common to both input amplifiers. A transistor 210 and a resistor 211 form one input amplifier while transistor 213 and resistor 214 form the other input amplifier. Capacitors 216 and 217 couple the input signal to each input amplifier. The second stage consists of a differential pair of transistors 220 and 221 and load resistors 222 and 223. Transistors 225, 226 and 227 and diodes 230, 231 and 232 provide proper bias to transistors 220 and 221 with common-mode feedback. This biasing is necessary in some cases to lower the common-mode gain of transistors 220 and 221 since there is an undesired positive common-mode feedback loop around the entire amplifier. Transistors 225 and 226 and diodes 230-232 are biased with current from transistor 235. Transistors 210 and 213 are biased with common-mode feedback from transistors 220, 221, 237, diodes 238 and 239, and resistors 241 and 242. Biasing current is provided by resistors 245 and 247 and transistor 246. Resistors 241 and 242 and capacitors 216 and 217 are chosen consistent with the low frequency cutoff of the circuit and with the size limitations of the integrated circuit. Resistors 241 and 242 should be much larger than feedback resistors 260 and 261 to ensure good noise performance. The photodetector (MSM in this case) is modeled by current source 250 and capacitor 251. The voltage offset means are implemented with source follower transistors 255 and 256 and level-shifting diodes 257, 258 and 259. Transistors 256 and 285 provide bias current to level-shifting diodes 257-259. Feedback resistors 260 and 261 couple the offset output signals back to the inputs of the photodetector. The output can be taken from the sources or gates of transistors 255 and 256, or from the offset means diodes 257, 258 and 259.

The circuit of FIG. 5 is an illustration of a specific implementation of a transimpedance amplifier circuit according to the invention. Numerous modifications and variations will become apparent to those skilled in the art once the above disclosure is fully appreciated. It is to be understood that the above detailed description of the preferred embodiment is intended to be merely illustrative of the spirit and scope of the invention and should not be taken in a limiting sense. The scope of the claimed invention is better defined with reference to the following claims.

I claim:

1. A balanced transimpedance amplifier circuit comprising:
   a first amplifier circuit for amplifying a first signal at a first input line;
   a second amplifier circuit for amplifying a second signal at a second input line;
   a first capacitor coupled between said first input line and an input node of said first amplifier circuit;
   a second capacitor coupled between said second input line and an input node of said second amplifier circuit;
   a first feedback network coupled between an output line of said first amplifier circuit and said first input line;
   a second feedback network coupled between an output line of said second amplifier circuit and said second input line;
   a first voltage offset means coupled in series with said first feedback network; and
   a second voltage offset means coupled in series with said second feedback network.

2. The balanced transimpedance amplifier circuit as recited in claim 1 further comprising:
   a first automatic gain control circuit coupled to said first amplifier circuit; and
   a second automatic gain control circuit coupled to said second amplifier circuit.

3. The balanced transimpedance amplifier circuit as recited in claim 1 further comprising:
   a first automatic gain control circuit coupled to said first feedback network; and
   a second automatic gain control circuit coupled to said second feedback network.

4. The balanced transimpedance amplifier circuit as recited in claim 2 wherein said first automatic gain control circuit includes a variable impedance device.

5. The balanced transimpedance amplifier circuit as recited in claim 3 wherein said first automatic gain control circuit includes a variable impedance device.

6. The balanced transimpedance amplifier circuit as recited in claim 4 wherein said variable impedance device includes first and second diodes coupled in parallel.

7. The balanced transimpedance amplifier circuit as recited in claim 5 wherein said variable impedance device includes first and second diodes coupled in parallel.

8. The balanced transimpedance amplifier circuit as recited in claim 4 wherein said variable impedance device includes a transistor.

9. The balanced transimpedance amplifier circuit as recited in claim 5 wherein said variable impedance device includes a transistor.

10. The balanced transimpedance amplifier circuit as recited in claim 2 wherein said first automatic gain control circuit is coupled to an input node of said first amplifier circuit.

11. The balanced transimpedance amplifier circuit as recited in claim 3 wherein said first automatic gain control circuit is connected in parallel with said first feedback network.

12. The balanced transimpedance amplifier circuit as recited in claim 1 further comprising a photodetector coupled to said first and second input lines.

13. The balanced transimpedance amplifier circuit as recited in claim 12 wherein said photodetector is a metal-semiconductor-metal detector.

14. The balanced transimpedance amplifier circuit as recited in claim 13 wherein said photodetector and said first and second amplifier circuits are fabricated on a single gallium arsenide integrated circuit chip.

15. The balanced transimpedance amplifier circuit as recited in claim 1 wherein said first and second amplifier circuits are single-ended amplifiers.

16. The balanced transimpedance amplifier circuit as recited in claim 1 wherein said first amplifier circuit is biased with a DC common-mode feedback loop.

17. The balanced transimpedance amplifier circuit as recited in claim 1 wherein said first amplifier circuit includes a transistor having a control terminal coupled to said first capacitor and a second terminal connected to a first power supply terminal.

18. The balanced transimpedance amplifier circuit as recited in claim 17 further comprising a load resistor connected between a third terminal of said transistor and a second power supply terminal.

19. The balanced transimpedance amplifier circuit as recited in claim 18 wherein said transistor is a field-effect transistor.

20. The balanced transimpedance amplifier circuit as recited in claim 18 wherein a voltage drop across said transistor summed with a voltage drop across said load resistor equals a difference in the voltage levels between said first and second power supply terminals.

21. The balanced transimpedance amplifier circuit as recited in claim 1 wherein said first voltage offset means is connected to the output line of said first amplifier circuit and to said first feedback network, and wherein said second voltage offset means is connected to the output line of said second amplifier circuit and to said second feedback network.

22. A balanced transimpedance amplifier circuit comprising:

a first amplifier stage including a first amplifier circuit for amplifying a first signal at a first input line and a second amplifier circuit for amplifying a second signal at a second input line;

a second amplifier stage including a differential amplifier circuit having a first input node coupled to an output node of said first amplifier circuit and having a second input node coupled to an output node of said second amplifier circuit;

a first capacitor coupled between said first input line and an input node of said first amplifier circuit;

a second capacitor coupled between said second input line and an input node of said second amplifier circuit;

a first feedback network coupled between a first output line of said differential amplifier circuit and said first input line;

a second feedback network coupled between a second output line of said differential amplifier circuit and said second input line;

a first voltage offset means coupled in series with said first feedback network; and a second voltage offset means coupled in series with said second feedback network.

23. The balanced transimpedance amplifier circuit as recited in claim 22 further comprising:

a first automatic gain control circuit coupled to said first amplifier circuit; and a second automatic gain control circuit coupled to said second amplifier circuit.

24. The balanced transimpedance amplifier circuit as recited in claim 22 further comprising:

a first automatic gain control circuit coupled to said first feedback network; and a second automatic gain control circuit coupled to said second feedback network.

25. The balanced transimpedance amplifier circuit as recited in claim 23 wherein said first automatic gain control circuit includes a variable impedance device.

26. The balanced transimpedance amplifier circuit as recited in claim 24 wherein said first automatic gain control circuit includes a variable impedance device.

27. The balanced transimpedance amplifier circuit as recited in claim 25 wherein said variable impedance device includes first and second diodes coupled in parallel.

28. The balanced transimpedance amplifier circuit as recited in claim 26 wherein said variable impedance device includes first and second diodes coupled in parallel.

29. The balanced transimpedance amplifier circuit as recited in claim 25 wherein said variable impedance device includes a transistor.

30. The balanced transimpedance amplifier circuit as recited in claim 26 wherein said variable impedance device includes a transistor.

31. The balanced transimpedance amplifier circuit as recited in claim 22 further comprising a photodetector coupled to said first and second input lines.

32. The balanced transimpedance amplifier circuit as recited in claim 31 wherein said photodetector is a metal-semiconductor-metal detector.

33. The balanced transimpedance amplifier circuit as recited in claim 32 wherein said photodetector and said first and second amplifier circuits are fabricated on a single gallium arsenide integrated circuit chip.

34. The balanced transimpedance amplifier circuit as recited in claim 22 wherein said first and second amplifier circuits are single-ended amplifiers.

35. The balanced transimpedance amplifier circuit as recited in claim 22 wherein said first input node of said differential amplifier circuit is a non-inverting input terminal and wherein said second input node of said differential amplifier circuit is an inverting input terminal.

36. The balanced transimpedance amplifier circuit as recited in claim 22 wherein said first output line of said differential amplifier circuit is a non-inverting output terminal and wherein said second output line of said differential amplifier circuit is an inverting output terminal.

37. The balanced transimpedance amplifier circuit as recited in claim 22 wherein said first amplifier circuit includes:

a transistor having a control terminal coupled to said first capacitor and a second terminal connected to a first power supply terminal; and a load resistor connected between a third terminal of said transistor and a second power supply terminal.

38. The balanced transimpedance amplifier circuit as recited in claim 37 wherein a voltage drop across said transistor summed with a voltage drop across said load resistor equals a difference in the voltage levels between said first and second power supply terminals.

39. The balanced transimpedance amplifier circuit as recited in claim 22 wherein said first voltage offset means is connected to the first output line of said differential amplifier circuit and to said first feedback network, and wherein said second voltage offset means is connected to the second output line of said differential amplifier circuit and to said second feedback network.

40. A method for biasing a balanced transimpedance amplifier circuit, said transimpedance amplifier circuit including a first and a second amplifier circuit for amplifying signals at a first and a second input line, respectively, a first feedback network coupled between a first output line of said transimpedance amplifier circuit and said first input line, and a second feedback network coupled between a second output line of said transimpedance amplifier circuit and said second input line, said method comprising the steps of:

DC level shifting a first signal at said first output line;

DC level shifting a second signal at said second output line;

providing said first DC level shifted signal to said first input line through said first feedback network;

providing said second DC level shifted signal to said second input line through said second feedback network;

AC coupling said first input line to an input node of said first amplifier circuit; and AC coupling said second input line to an input node of said second amplifier circuit;

whereby a bias voltage across said first and second input lines is established independent of the voltage levels at the input nodes of said first and second amplifier circuits.

41. The method for biasing a balanced transimpedance amplifier circuit as recited in claim 40 further comprising the step of controlling the gain of said transimpedance amplifier circuit.

42. The method for biasing a balanced transimpedance amplifier circuit as recited in claim 40 further comprising the steps of:

providing an output signal of said first amplifier circuit to an input node of a differential amplifier circuit; and providing an output signal from said second amplifier circuit to a second input node of said differential amplifier circuit.

* * * * *

UNITED STATES PATENT AND TRADEMARK OFFICE
CERTIFICATE OF CORRECTION

PATENT NO.   : 5,343,160
DATED        : August 30, 1994
INVENTOR(S)  : Stewart S. Taylor It is certified that error appears in the above-identified patent and that said Letters Patent is hereby corrected as shown below:

Column 3, line 20, delete "-" and insert --.--.

Column 4, line 8, delete "-" and insert --.--.

Signed and Sealed this

Twenty-first Day of March, 1995

BRUCE LEHMAN

Attest:

Attesting Officer

Commissioner of Patents and Trademarks